(12) United States Patent
Fotouhi

(10) Patent No.: US 6,323,703 B1
(45) Date of Patent: Nov. 27, 2001

(54) INDIRECT OUTPUT CURRENT SENSING

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/564,254

(22) Filed: May 4, 2000

(51) Int. Cl.[7] .................................................. H03B 1/00
(52) U.S. Cl. ......................... 327/112; 327/313; 327/391
(58) Field of Search .................................. 327/112, 309, 327/310, 312, 313, 327, 391

(56) References Cited

U.S. PATENT DOCUMENTS

| | | | |
|---|---|---|---|
| 4,814,638 | * 3/1989 | Weick | 326/82 |
| 4,910,416 | * 3/1990 | Salcone | 327/374 |
| 5,099,138 | * 3/1992 | Fukunaga | 327/109 |
| 5,220,206 | * 6/1993 | Tsang et al. | 327/544 |
| 5,365,118 | * 11/1994 | Wilcox | 327/109 |
| 5,386,336 | 1/1995 | Kim et al. | |
| 5,543,045 | * 8/1996 | Sauer | 327/561 |
| 5,585,763 | 12/1996 | Navabi et al. | |
| 5,847,554 | * 12/1998 | Wilcox et al. | 323/282 |
| 5,920,226 | * 7/1999 | Mimura | 327/537 |
| 6,147,545 | * 11/2000 | Marshall | 327/424 |

\* cited by examiner

*Primary Examiner*—Terry D. Cunningham
(74) *Attorney, Agent, or Firm*—Kenneth R. Backus, Jr.; Townsend and Townsend and Crew LLP

(57) ABSTRACT

An indirect current sensing circuit and method for current limiting output driver circuitry is disclosed. The present invention is capable of preventing device damage and circuit disruption by maintaining output voltage signal integrity and consuming negligible power. Furthermore, the indirect current sensing circuit and method is independent of semiconductor process variations and thus is more reliable over prior art current sensing techniques. The indirect current sensing circuit and its method of current limiting, according to the present invention, can reliably drive transmission lines in networking system and communication applications.

16 Claims, 6 Drawing Sheets

INDIRECT OUTPUT CURRENT SENSING

BACKGROUND OF THE INVENTION

The present invention relates in general to output drivers within integrated circuits (ICs), and in particular to current limited output driver circuits.

Many electronic devices require protection from the environs in which they operate. When certain physical conditions arise, such as the occurrence of opens in signal conductors or shorts to various power supply buses, the above conditions may impair device operation or even damage the device itself. For example, a power supply circuit designed to provide a specific operational current can be quickly damaged or destroyed if an excessive amount of load current is drawn. Similarly, communication and networking system circuits, such as line drivers and receivers, often encounter similar over-current conditions that may prevent the device from meeting certain interface specifications.

Depending on an electronic device's performance requirements, it is desirable to internally limit current either driven or drawn by the device. Internal current limiting circuitry eliminates the need for providing additional circuitry for external current limiting protection. To this end, output driver circuits have been designed to minimize adverse effects from excessive current when, for example, the output is short-circuited.

In certain applications, such as in networking systems, transceiver devices are used to drive and receive data along transmission lines in accordance with specific networking protocol such as V.28 (RS-232), V.35, RS449, EIA-530-A, X.21, etc. When transmissions lines are driven under load conditions, internally generated voltage levels correspondingly decrease as current is drawn by the load. If over-current conditions arise along the transmission lines, internal voltage levels can be corrupted, resulting in device malfunction. Furthermore, when subject to excessive current conditions, semiconductor structures within a device can be irreparably damaged. Hence, limiting output driver current below a target level is a significant goal in the design of output driver circuits.

A conventional approach senses the current of an output driver transistor directly to determine whether an over-current condition exists. That is, the output current itself is tapped into and is used to monitor over-current events. In a particular output driver circuit, a sensing resistor is placed in series with an output drive transistor to provide for "direct sensing" of the output current. Additionally, an over-current detecting circuit is coupled to the output driver circuit for measuring the voltage drop across the sensing resistor. In operation, when a certain amount of current flows through the sensing resistor, a potential difference develops across the resistor. The monitoring circuitry first compares the potential difference to a reference voltage and then determines whether an overcurrent condition exists. Upon detection of an over-current condition, the monitoring circuitry disables or "shuts off" the respective output drive transistor. The output current is thus limited by way of direct sensing.

FIG. 1 illustrates a common approach to current limiting output driver circuit 100 by way of directly sensing the output current. Output driver circuit 100 comprises pull-up driver circuit 112, pull-down driver circuit 111, input terminal 102 and output terminal 104. Since both driver circuits are structurally and functionally similar, the following discussion regarding the pull-down driver circuit applies to the pull-up driver as well.

Pull-down driver circuit 111 consists essentially of output drive transistor 106 (e.g., M1), sensing resistor 108 (e.g., R1) and over-current detecting circuit 110. In operation, a signal to be driven is received at input terminal 102 and driven out from output terminal 104. For example, when a relatively high voltage signal, such as +3.3 or +5 volts, is applied to input terminal 102, output drive transistor 106 activates to drive a relatively low voltage signal at output terminal 104. Correspondingly, M1 "sinks" output current ("Iout") 122 into output terminal 104 and through both M1 and R1 to change the output voltage level. If Iout is excessive, then the voltage ($\Delta V$) developing across R1 triggers the over-current detecting circuit to shut down the output driver circuit, thus alleviating the over-current condition.

A significant drawback to this approach is that the sensing resistor, in series with its respective output drive transistor, adversely affects the output signal integrity. To minimize such effects, the voltage drop across the resistor must be limited to a small amount, for example, 100 millivolts. To achieve this minimal voltage drop, the sensing resistor must have a relatively low resistance, such as approximately 1 ohm, or less. Manufacturing such resistors with acceptable accuracy and reliability, however, in present semiconductor processing technologies, such as CMOS, is both difficult and costly. Without reliably precise resistor values, there is a general risk of increased power dissipation associated with the voltage drop across the sensing resistor as well as a disruption in circuit operation due to degraded signal integrity. Signal degradation occurs, for example, when the magnitude of the output voltage swing is diminished due to the voltage drops across R1 and R2. Moreover, the decreased output voltage swings by a driver circuit leads to disruptions in device operation.

Furthermore, in applications requiring relatively high output currents, geometric sizes of both M1 and M2 must be large enough to reduce their output resistances. An increased size in output drive transistors, however, both increases the size of electronic device and limits the functionality of the electronic device.

Therefore, there is a need for a circuit and a method for indirectly sensing over-current conditions in output driver circuits that is not influenced by semiconductor process variations, that maintains output voltage signal integrity and does not consume more power than is necessary.

SUMMARY OF THE INVENTION

The present invention provides an output driver circuits using an indirect current sensing circuit and technique, wherein semiconductor processing variation effects, signal integrity degradation and power dissipation are minimized. Accordingly, in one embodiment, the present invention provides an output driver circuit for driving an output terminal having an output transistor circuit coupled to the output terminal, and a current sensing circuit, wherein the current sensing circuit is configured to replicate proportionately an output current and to sense indirectly an over-current condition. In another embodiment, the current sensing circuit includes an indirect sensing circuit configured to monitor the current condition at the output transistor, and an over-current detecting circuit configured to detect the over-current condition in the indirect sensing circuit. In yet another embodiment, the output transistor circuit further includes a drive limiting circuit configured to alleviate the over-current condition.

A better understanding of the nature and advantages of the present invention may be had with reference to the detailed description and drawings below.

DESCRIPTION OF SPECIFIC EMBODIMENTS

The following detailed description of specific embodiments, including preferred embodiments, reference the accompanying drawings that form part of this disclosure. The drawings illustrate exemplary embodiments and describe how to practice the invention. Without departing from the scope of the present invention, other embodiments may be used in place of those shown and described, and such substitutions should be apparent to one of ordinary skill in the art upon reading this disclosure.

Figure 2:
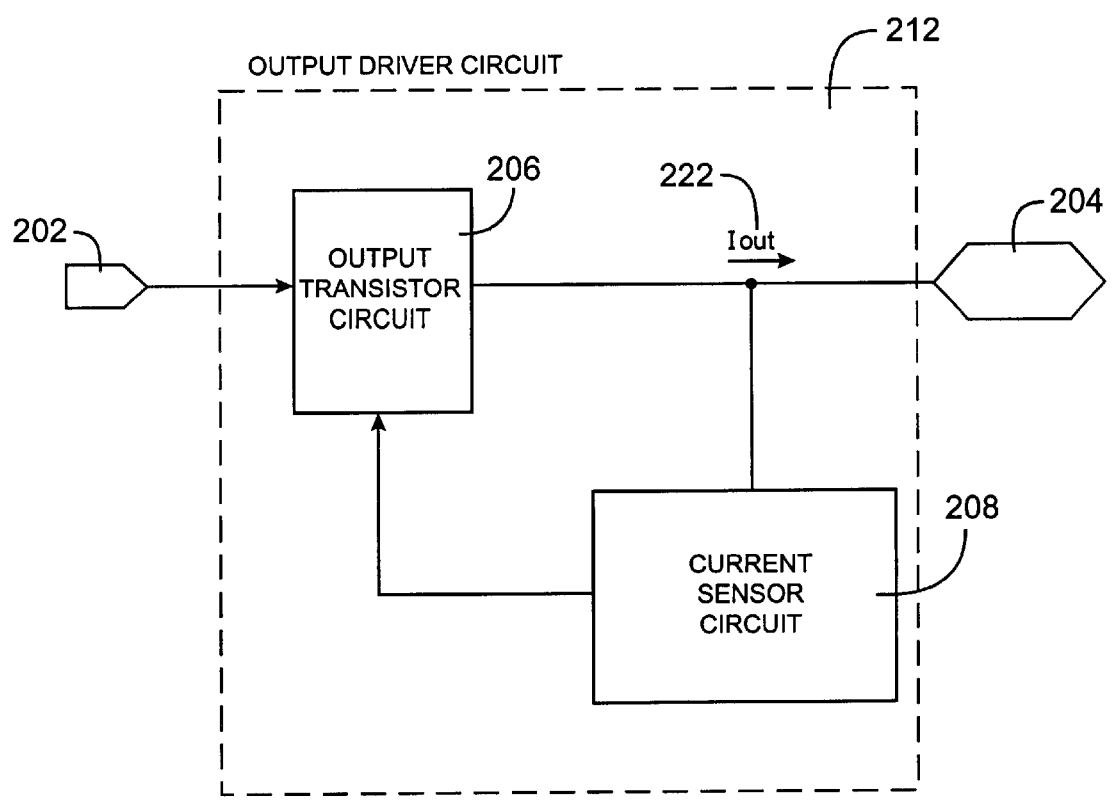
FIG. 2 is a block diagram of an embodiment of an output driver circuit with the current sensing techniques according to the present invention.

In one embodiment of the present invention, an output driver circuit is current limited to a pre-defined level wherein potentially damaging over-current conditions are indirectly sensed and alleviated within the output driver circuit. FIG. 2 shows a simplified block diagram of an exemplary embodiment of current-limited output driver 212 according to the present invention.

The current limited output driver 212 of FIG. 2 includes output transistor circuit 206 and current sensing circuit 208. Output driver circuit 212 has both input terminal 202 and output terminal 204. Current sensing circuit 208 is electrically coupled to both output transistor circuit 206 and output terminal 204 for "indirectly sensing" current conditions at the output terminal.

Figure 1:
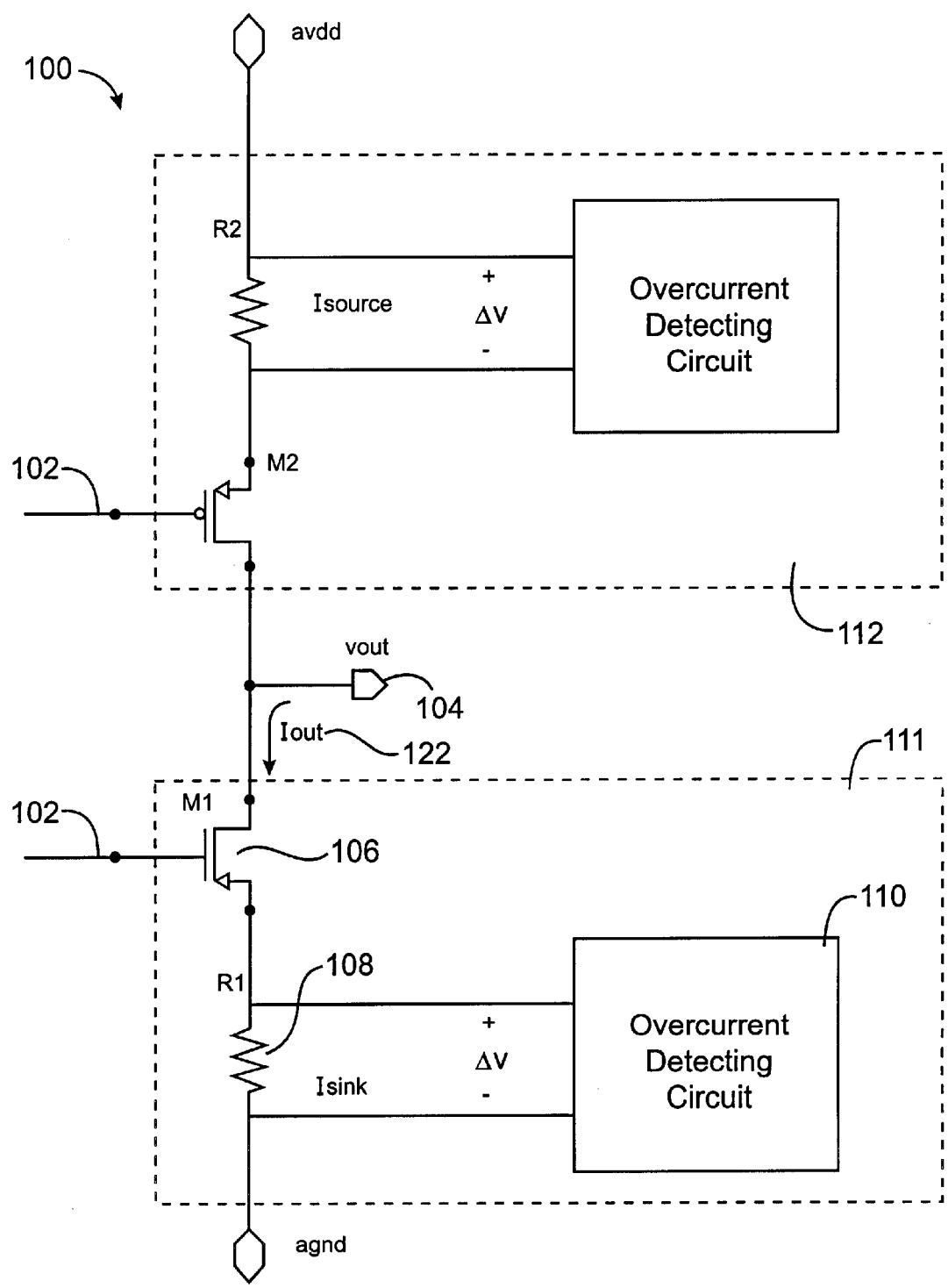
FIG. 1 is a schematic diagram of a prior art circuit for sensing output current.

Unlike the direct current sensing circuit described in FIG. 1, current sensing circuit 208 of the present invention monitors over-current conditions first by generating a replicated current proportional to the output current, and then by determining whether the replicated current itself exceeds a pre-defined current level. Therefore, the invention disclosed herein indirectly senses output current without the drawbacks associated with direct sensing prior art circuits and techniques as described above.

Current sensing circuit 208 is configured further to deliver a signal to output transistor circuit 206 upon detection of an over-current condition. Output transistor circuit 206 contains internal circuitry first to receive the signal indicating the existence of a non-compliant current level, and second, to control driver circuitry to mitigate output over-currents. In one embodiment, output transistor circuit 206 includes a push-pull type amplifier output stage. In another embodiment, the output transistor circuit includes an output stage comprised of a pull up driver, such as a PMOS transistor, and a pull down driver, such as an NMOS transistor.

In operation, output driver circuit 212 receives a signal at its input terminal 202. In turn, output driver circuit 212 drives the received signal out from its output terminal 204 to either another circuit within an integrated circuit ("IC") or to an external environment beyond the IC package in which the output driver resides. In an exemplary application, output driver circuit 212 is used to drive signals along transmission lines and provides sufficient output drive current ("Iout") 222, for example approximately +150 mA, under various load conditions.

Depending on the signal to be driven, output driver circuit 212 either drives or "sources" current out from output terminal 204 ("Isource"), or alternatively, draws or "sinks" current into output terminal 204 ("Isink"). For example, when output driver circuit 212 is driving a low voltage signal, internal circuitry within the driver circuit causes sufficient current to sink into output terminal 204 to change a previous high voltage state to a low voltage state. The current drawn into the driver generally is held to a minimum amount to change the output voltage level without unnecessary power consumption. An opposite action occurs when output driver circuit 212 is driving a high voltage signal from a previously low voltage state. Although this detailed description of the invention describes an exemplary embodiment using high voltage signals and states, as well as low voltage signal and states, it should be understood that such signal and state levels are relative to each other. In one embodiment, a voltage signal may include high and low logical states, such as a five and zero volts D.C. In another embodiment, a voltage signal to be driven by the present invention may have an intermediate voltage level that is relatively higher than another voltage signal having a lower intermediate voltage level. Such higher intermediate voltage levels are described herein to be a "high voltage" signal. In yet another embodiment, the voltage signals to be driven may be analog as well as digital.

In certain circumstances, however, output driver circuit 212 may be subject to excessive load conditions (i.e., increased load current) wherein the amount of current sourced or sunk by the driver circuit is beyond its nominal operational current level (i.e., "over-current" condition). For example, such circumstances may arise when a resistive short exists between output terminal 204 and either another signal conductor, a voltage supply bus, or a ground potential. When a short couples output terminal 204 to a conductor having an opposite polarity than that being driven by output driver circuit 212, then excessive current is either driven or drawn.

Current sensing circuit 208 of the present invention replicates the output current indirectly sensed from output terminal 204, and then determines whether the replicated current level exceeds pre-defined maximum current limits. If the replicated current level becomes excessive, the present invention correspondingly generates a signal to initiate corrective action. Upon receiving such signal, internal circuitry of output driver circuit 212 functions to limit the excessive output current condition. A detailed explanation of the interaction between indirectly sensed over-current conditions at output terminal 204 and the current limiting circuitry of output driver circuit 212 will be presented below in connection with FIG. 4A.

Figure 3:
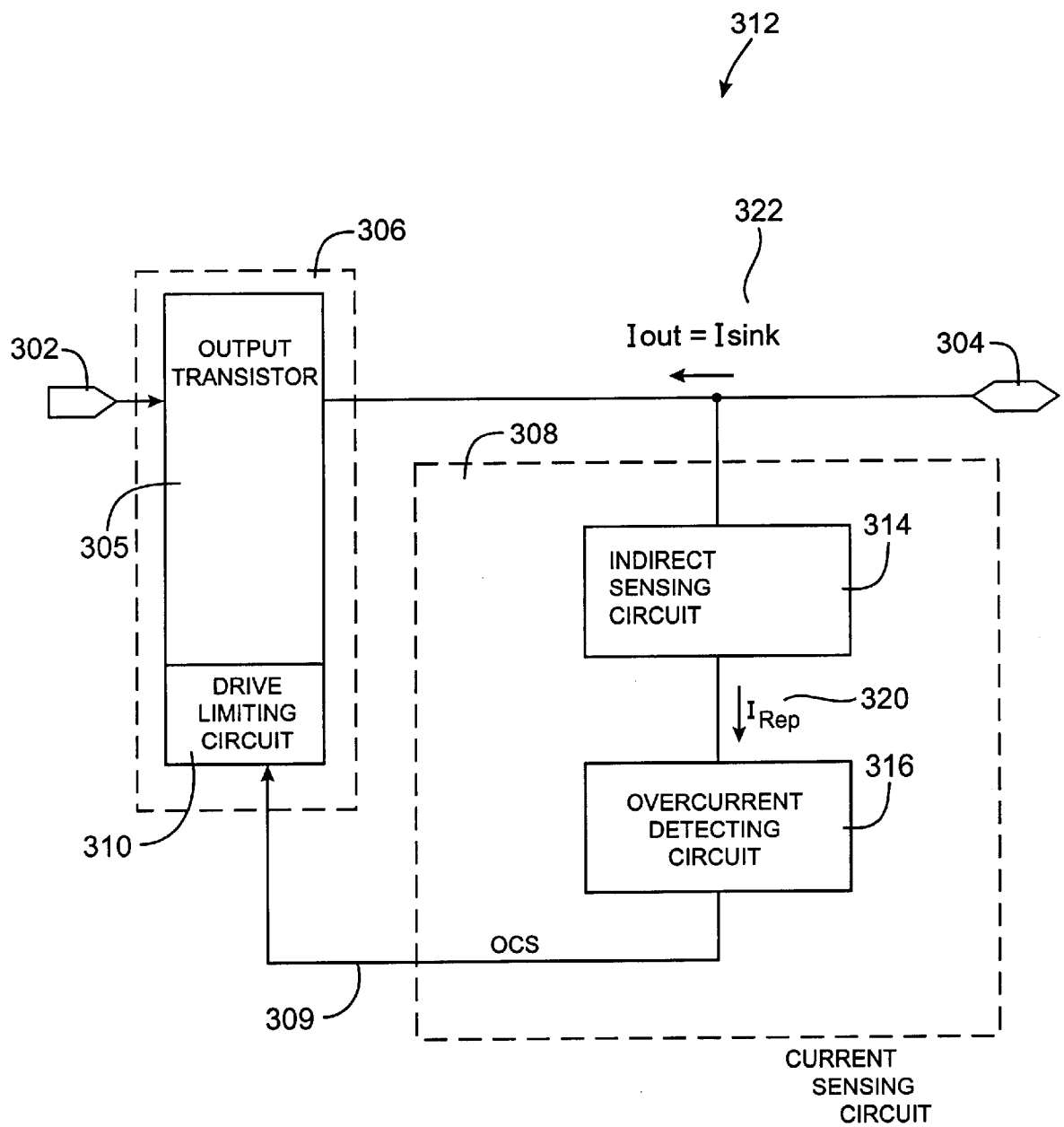
FIG. 3 is a block diagram of an exemplary current sensing circuit according to one embodiment of the present invention.

FIG. 3 is a block diagram showing an exemplary embodiment of output driver circuit 312 of the present invention having output transistor circuit 306 and current sensing circuit 308. Output transistor circuit 306 includes output transistor 305 and drive limiting circuit 310. For example, output transistor 305 is a MOSFET driver that receives a signal to be transmitted at terminal input 302, such as a MOS transistor gate, and correspondingly drives the signal out to output terminal 304 from a MOS transistor drain terminal. In the event that excessive drive current develops at output terminal 304, the associated drive limiting circuit 310, when triggered by over-current signal ("OCS") 309, functions to limit output transistor 305 to curtail the over-current condition.

Current sensing circuit 308 includes indirect sensing circuit 314 and over-current detecting circuit 316. Indirect sensing circuit 314 is configured to first indirectly sense or monitor the current conditions ("Iout") 322 at output terminal 304, and second, to generate a replicated current ("Irep") 320. The input of indirect sensing circuit 314 is a high impedance stage and draws negligible current unlike prior art current limiting techniques. This circuit serves to monitor "indirectly" Iout 322 by comparing the replicated current, rather than Iout, to a pre-defined maximum current level to determine whether an over-current conditions exists at the output terminal. By indirectly sensing Iout, there are no voltage drops across sensing resistors to either dissipate power or affect the signal voltage level. Thus, this inventive circuit consumes substantially less power and preserves output signal integrity.

The output of indirect sensing circuit 314 is coupled to over-current detecting circuit 316 for determining whether an Iout is excessive. Over-current detecting circuit 316 functions to first receive Irep, second to compare Irep to a pre-defined maximum current level ("Iref"), and third to generate a signal ("OCS") 309 flagging the existence of an over-current condition.

Over-current detecting circuit 316 is coupled to output transistor circuit 306 for conveying the existence of a non-compliant current level at output terminal 304. Upon detecting an excessive current condition, over-current detecting circuit 316 outputs OCS 309 which is then received by drive limiting circuit 310 within the output transistor circuit. Drive limiting circuit 310 functions to limit the current in the output transistor 305, thus controlling the maximum current either sourced from or sunk into output driver circuit 312.

In one embodiment, current sensing circuit 308 is coupled between output terminal 304 and drive limiting circuit 310 to detect and to rectify excessive currents "sunk into" output driver circuit 312. Current sensing circuit 308 operates to indirectly monitor currents which excessively "enter" output driver circuit 312. In another embodiment, current sensing circuit 308 is coupled between output terminal 304 and drive limiting circuit 310 to detect and to rectify excessive currents "sourced from" output driver circuit 312. In this embodiment, current sensing circuit 308 operates to indirectly monitor currents which excessively "exit" output driver circuit 312.

Figure 4A:
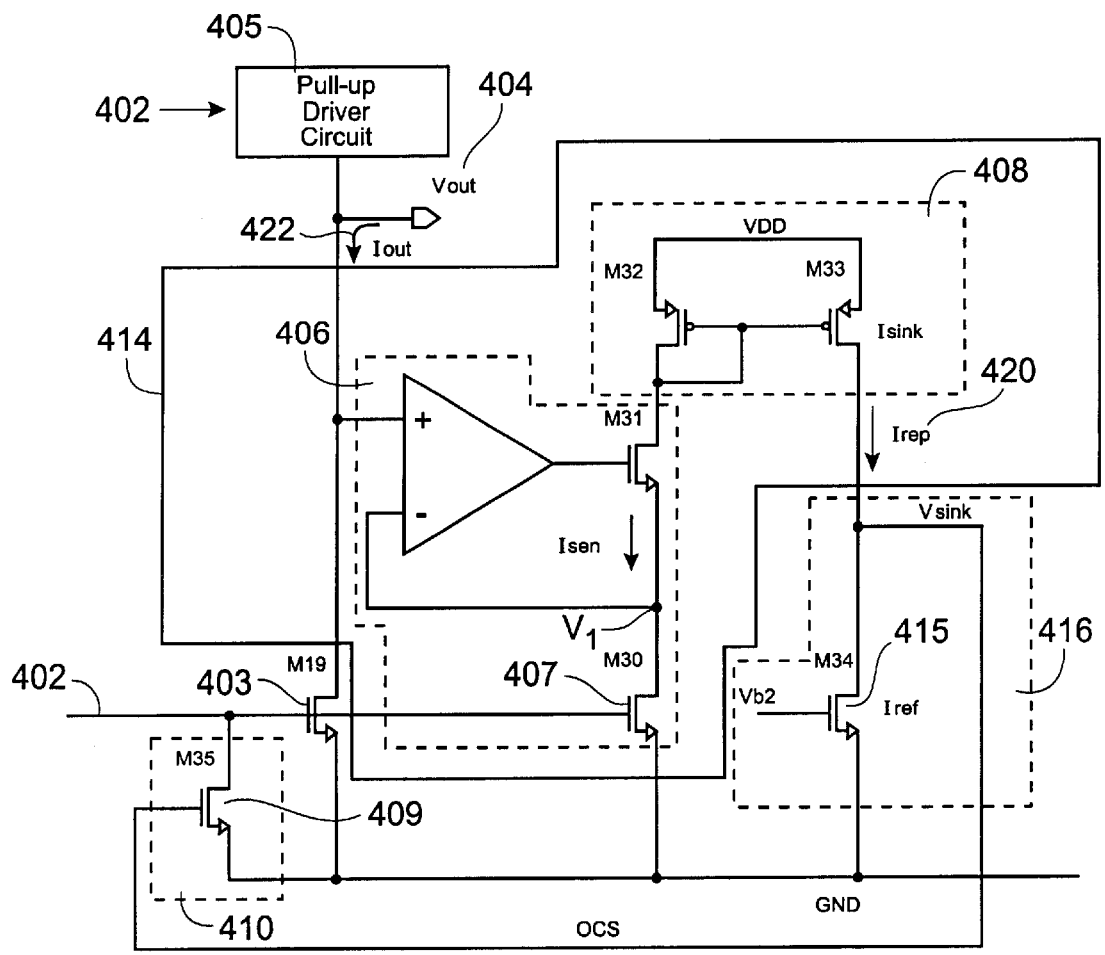
FIG. 4A is a circuit schematic of an embodiment of an output driver circuit using indirect current sensing circuitry.

FIG. 4A is a diagram showing a specific embodiment of the present invention and describes exemplary output driver circuit 412. One embodiment of output driver circuit 412 includes pull-up driver circuit 405 coupled to both output terminal 404 and to a pull-down driver circuit having output drive transistor 403 (e.g., M19), wherein each driver circuit includes an input 402.

Output driver circuit 412 functions to drive signals received at input terminal 402 out from output terminal 404. For example, if a low voltage signal is applied to input terminal 402, output drive transistor 403 and current sensing circuit 414 are disabled by transistors M19 and M30, respectively. A low voltage signal applied to pull-up driver circuit 405 causes a high voltage signal to be driven out from output terminal 404. Pull-up driver circuit 405 according to the present invention is described in FIG. 5.

A high voltage signal applied to input terminal 402 disables pull-up driver circuit 405. Output drive transistor 403, however, is activated to drive a lower voltage signal at output terminal 404. Additionally, a high voltage signal at the gate of M30 enables current sensing circuit 414 to indirectly monitor Iout 422 by permitting sensed current, Isen, to flow through buffering circuit 406.

In another embodiment, output driver circuit 412 includes current sensing circuit 414 and over-current detecting circuit 416. Current sensing circuit 414 includes buffering circuit 406 having a high impedance sensing input, and current replicating circuit 408 for generating a current proportional to Iout.

Exemplary buffering circuit 406 includes an operational amplifier ("op-amp"), wherein the op-amp's high input impedance provides for the indirect sensing of the Iout 422. In exemplary buffering circuit 406, an op-amp input is coupled to output terminal 404 to monitor Iout 422 indirectly. Another op-amp input is indirectly coupled to the op-amp's output to form a buffering circuit, such as a voltage follower circuit. In another embodiment of buffering circuit 406, the op-amp output is coupled to the gate of a MOSFET (e.g., M31) to modulate the current through the MOSFET corresponding to fluctuations in Iout 422 and operates similar to a voltage-to-current converter. Furthermore, the MOSFET ensures that the current flowing between M32 and M30 (i.e., Isen) does not enter the op-amp's output. In yet another embodiment, the op-amp is configured as a non-inverting op-amp, and in still another embodiment, the op-amp is configured to have unity gain.

Figure 5:
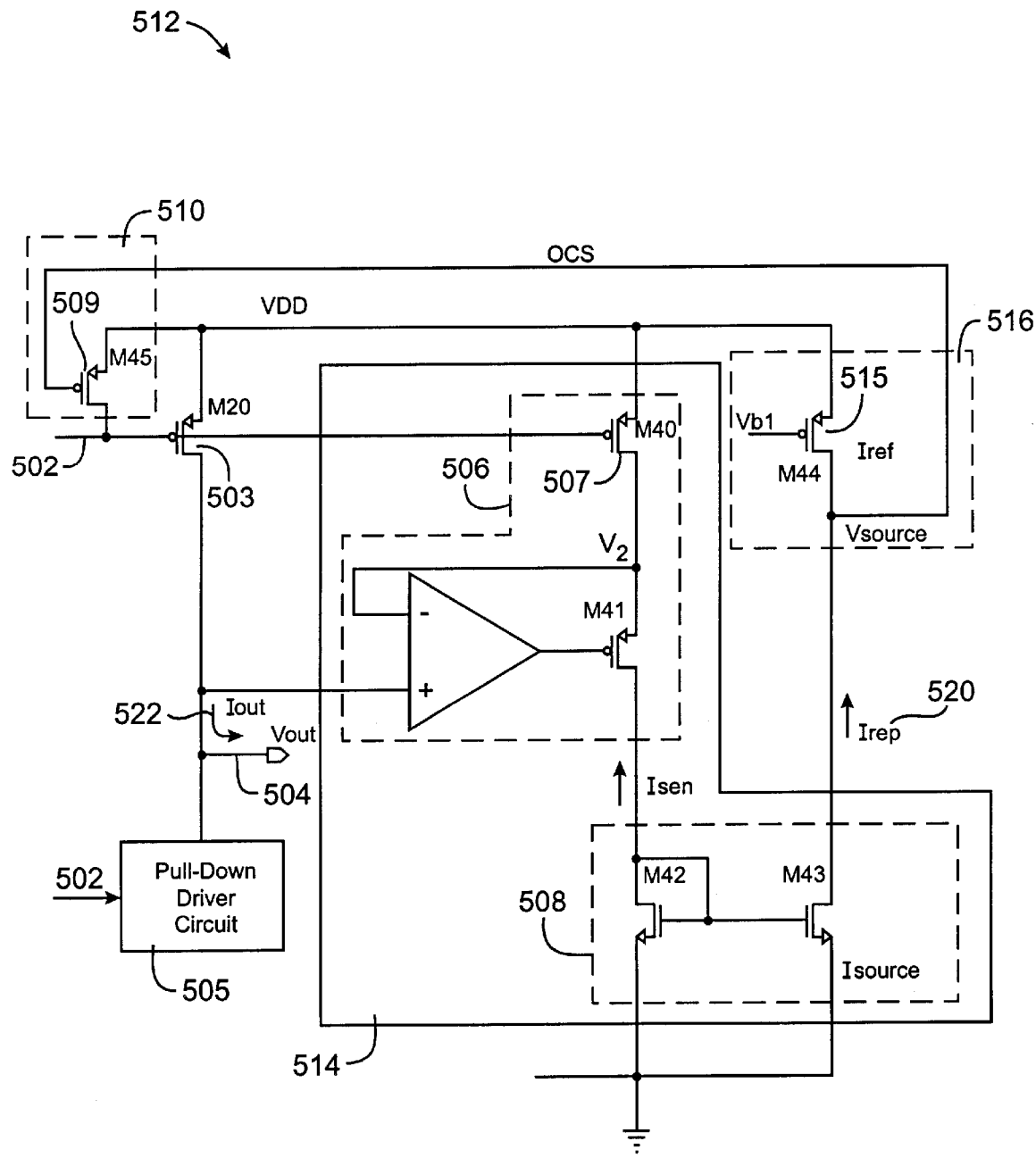
FIG. 5 is a circuit schematic showing another embodiment of an output driver circuit similarly described in accordance with FIG. 4A.

Exemplary buffering circuit 406 also includes sensing transistor 407. Sensing transistor 407 is, for example, a MOSFET having a source, a gate and a drain. The drain of the sensing transistor is coupled to node V1 (or V2 as depicted in FIG. 5), which is also coupled to an op-amp input and to the source of the MOSFET at the op-amp output (e.g., M31). The gate of sensing transistor 407 is coupled to the gate of output drive transistor 403 (e.g. M19) for receiving the signal that is to be driven out through output terminal 404. The source of sensing transistor 407 is coupled to a ground potential, such as zero volts (or to a biased potential, such as Vdd, as depicted in FIG. 5).

In one embodiment of output driver circuit 412, output drive transistor 403 and sensing transistor 407 have different geometric ratios such that Isen is proportional to Iout. For example, Isen flowing through M31 is equivalent to ¹⁄₁₀₀ of Iout through M19. With the relatively large ratio between M19 and M30, large deviations in Iout is sensed by sensing transistor 407 as a smaller deviation in Isen. In another embodiment, output drive transistor 403 is a short channel device for delivering sufficient drive current Iout at output terminal 404. Short channel devices, such as sensing transistor 407, are able to drive more current than non-short channel devices. Short channel devices, however, are sensitive to variations in Vds and such sensitivity must be accounted for when sensing and replicating Iout.

In operation, buffering circuit 406 functions to buffer over-current detection circuit 416 from the actual output current Iout 422 at output terminal 404. The high impedance input stage of the op-amp provides for sufficient buffering. Furthermore, buffering circuit 406 functions to ensure that Iout is accurately replicated by accounting for Vds sensitivities of output drive transistor 403. In one embodiment, the op-amp in combination with a MOSFET at its output (e.g., M31) provides for accurate replication. This combination ensures that Vds-sensitive output drive transistor 403 and sensing transistor 407 have the same Vds (i.e., Vds19= Vds30). When M19 and M30 have the same Vds, accurate current replication is accomplished. In particular, Isen accurately and proportionately tracks Iout.

FIG. 4A further depicts an illustrative current replicating circuit 408 comprising a current mirror circuit having an input and an output. The current mirror circuit uses Isen to generate a replicated current, Irep, which is proportional to Iout. In one embodiment, the current mirror comprises two MOSFETs (e.g., M32 and M33) wherein the sources of both transistors are coupled to a biased bus of a pre-defined potential, such as Vdd (or ground, as illustrated in FIG. 5). The current mirror input consists essentially of a first MOSFET (e.g., M32) drain coupled to both its own gate as well as to the gate of a second MOSFET (e.g., M33). The output of current replicating circuit 408 consists essentially of the second MOSFET's drain terminal.

Current replicating circuit 408 functions to replicate proportionally the current Isen through buffering circuit 406. First, the circuit receives at its input the sensed current (Isen) from buffering circuit 406. Isen relates to the amount of current contributing to the over-current condition, whether it is identical to or proportional to Iout. Second, the current replicating circuit 408 replicates the sensed current, Isen, and generates another current, Irep, which is proportional to Isen. Third, the current replicating circuit 408 outputs the resultant Irep to over-current detecting circuit 416. Lastly, the detecting circuit determines whether Irep represents a pre-defined over-current condition at output terminal 404.

In one embodiment, the MOSFETs comprising the current mirror circuit (e.g., M32 and M33) have different geometric device properties such that Irep is proportional to Isen. For example, the geometric ratios of the two MOSFETs may be designed such that Irep proportionately is less than Isen. With Irep less than Isen, a relatively lower maximum current level (i.e., Iref) may be set to detect an over-current condition.

Over-current detecting circuit 416 is coupled between the output of current replicating circuit 408 and the input of drive limiting circuit 410. Exemplary over-current detecting circuit 416 includes MOSFET 415 (e.g., M34) wherein its drain is coupled to current replicating circuit 408, its source is coupled to a bus having biased potential, such as Vdd or (ground as shown in FIG. 5), and its gate is biased to a voltage (e.g., Vb2) such that the drain-to-source current ("Ids") of MOSFET 415 is established to be Iref.

In one embodiment, detecting circuit 416 functions to compare Irep to a reference current Iref. In the event Irep exceeds Iref, the detecting circuit 416 generates and outputs a signal indicating an over-current condition (i.e., "Overcurrent signal," or "OCS"). That is, detecting circuit 416 includes a current comparator wherein Irep is evaluated against generated current Iref. In normal operation, Irep is less than Iref, thus setting Vsink, for example, to ground. As Iout increases, Irep approaches Iref, thus increasing Vsink. Once an over-current condition occurs at output terminal 404, Irep exceeds Iref, thus generating an OCS. The OCS is then sent to drive limiting circuit 409. Drive limiting circuit 409 in turn modulates the gate voltage of output driver transistor 403, thus decreasing Iout.

Figure 4B:
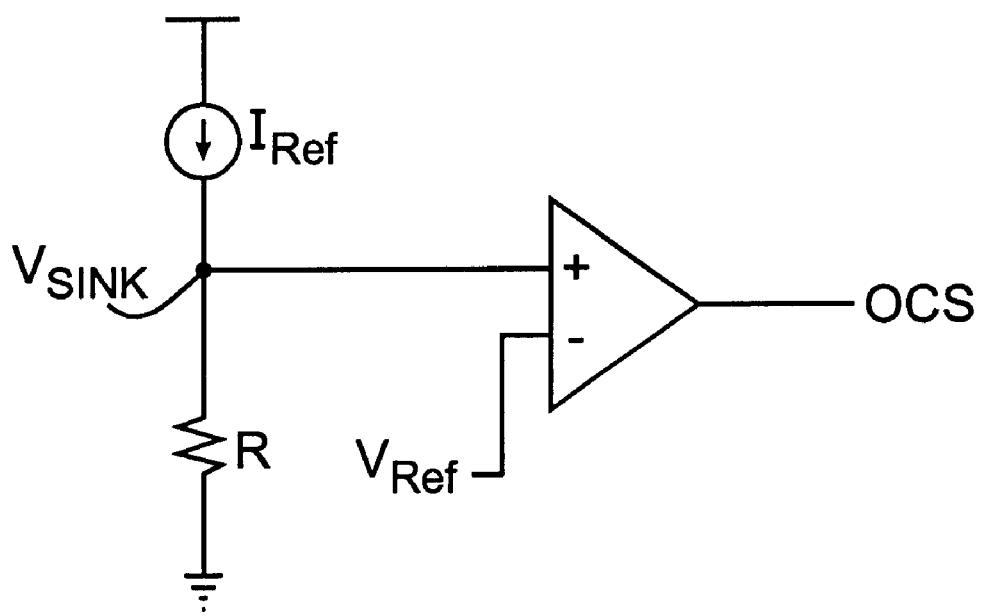
FIG. 4B is an exemplary circuit schematic of an embodiment of an over-current detecting circuit for use with indirect current sensing circuitry.

In another embodiment, Irep generates a voltage, Vsink, which is compared to a reference voltage, Vref, as illustrated in FIG. 4B. For example, generated voltage Vsink is compared to a Vref at their respective inputs into a op-amp comparator circuit. If the op-amp detects Vsink is greater than Vref, an OCS signal would be outputted.

Drive limiting circuit 410 is coupled between the pull-down driver circuit's output drive transistor 403 and the over-current detecting circuit 416. Exemplary drive limiting circuit 410 includes MOSFET 409 wherein its drain is coupled to the input of output drive transistor 403, its source is coupled to a biased bus of a pre-defined potential, such as Vdd (or ground as depicted in FIG. 5), and its gate is coupled to the output of over-current detecting circuit 416.

Upon receiving an OCS signal (i.e., "Vsink") at its input, drive limiting circuit 410 functions to limit the current in the output drive transistor 403. In operation, exemplary drive limiting circuit 410 is configured to receive an over-current signal, OCS. When an over-current condition is detected, the OCS is applied to, for example, the gate of a drive limiting MOSFET. In turn, drive limiting MOSFET 409 (e.g., M35) activates to limit the current in the output drive transistor 403 by pulling the gate voltage to a lower level, such as zero volts, that limits current flow through output drive transistor 403. The above described feedback of OCS to the drive limiting circuit repeats until Irep reaches Iref in equilibrium (i.e., Irep≈Iref). This automatic modulation of the output drive transistor gate voltage therefore acts to alleviate the over-current condition at output terminal 404 by maintaining Iout at peak current (i.e., Iout=Iout(max)).

In yet another embodiment, detecting circuit 416 is not only configured to deliver an OCS to a drive limiting circuit, but is also configured to alert a user of the occurrence of an over-current condition. For example, upon the occurrence of an over-current condition, the OCS is delivered to and stored in a register. The register flags the user that an OCS either has occurred or is occurring. Upon receiving notice of a pending OCS alert, the user is left to perform a user-defined function, such as manually correcting the over-current condition.

FIG. 5 is a diagram showing a specific embodiment of the present invention and describes exemplary output pull-up driver circuit 512. One embodiment of output driver circuit 512 includes pull-down driver circuit 505 coupled to both output terminal 504 and to a pull-up driver circuit having output drive transistor 503 (e.g., M20), wherein each driver circuit includes an input 502.

Output driver circuit 512 functions to drive signals at received input terminal 502 out from output terminal 504. For example, if a high voltage signal is applied to input terminal 502, output drive transistor 503 and current sensing circuit 514 are disabled by transistors M20 and M40, respectively. A high voltage applied to pull-down driver circuit 505 causes a low voltage signal to be driven out from output terminal 504. Pull-down driver circuit 505 according to the present invention is described in FIG. 4A.

A low voltage signal applied to input terminal 502 limits pull-down driver circuit 505. Output drive transistor 503, however, is activated to drive a logical high voltage at output terminal 504. Additionally, a low voltage signal at the gate of M40 enables inventive current sensing circuit 514 to monitor Iout 522 indirectly by permitting sensed current, Isen, to flow through buffering circuit 506.

In another embodiment, output driver circuit 512 includes current sensing circuit 514 and over-current detecting circuit 516, in which both are structurally and operationally similar to current sensing circuit 414 and over-current detecting circuit 416, respectively, as depicted in FIG. 4A. Similar to the detecting circuit in FIG. 4A, detecting circuit 516 of FIG. 5 includes MOSFET 515 (e.g., M44) with its gate biased to a voltage (e.g., Vb1) for generating Iref.

Drive limiting circuit 510, which includes MOSFET 509 (e.g., M45), is coupled between the pull-up driver circuit's output drive transistor 503 and the over-current detecting circuit 516. Exemplary drive limiting circuit 510 is structurally and operationally similar to drive limiting circuit 410, as depicted in FIG. 4A. Drive limiting circuit 510 operates to limit the current of the output drive transistor 503 by pulling the gate voltage to a higher level which then limits the current flow through output drive transistor 503. Therefore, the over-current condition at output terminal 504 is thus alleviated by maintaining Iout at is maximum allowable peak current, Iout (max).

In summary, a novel output driver circuit with indirect over-current sensing and method of indirect current sensing has been invented and is described herein. The inventive indirect over-current sensing approach neither affects the output signal integrity nor consumes more power than is necessary.

The above description is illustrative and not restrictive. Many variations of the invention will become apparent to those of skill in the art upon review of this disclosure. For example, the indirect over-current sensing circuit may be configured to operate with input drivers or other integrated circuits where current limiting is desired. Additionally, the indirect over-current sensing circuit and method may be implemented with other semiconductor technologies and devices, such as bipolar transistors. The scope of the invention should, therefore, be determined not with reference to the above description, but instead should be determined with reference to the appended claims along with their full scope of equivalents.

What is claimed is:

1. An output driver circuit to drive a signal out from an output terminal, the output driver circuit having an input configured to receive the signal and an output configured to drive the signal to the output terminal, the output driver circuit comprising:

an output transistor circuit coupled to the output terminal and the input;

a buffering circuit configured to indirectly monitor a current condition at the output terminal;

a current replicating circuit configured to generate a replicated current of the monitored current condition, wherein the current replicating circuit is a current mirror circuit; and an over-current detecting circuit configured to detect an over-current condition at the output terminal and to control the output transistor circuit.

2. The output driver circuit of claim 1, wherein the output transistor circuit further comprises:

a drive limiting circuit configured to alleviate the over-current condition; and an output transistor having a gate, a drain and a source.

3. The output driver circuit of claim 1, wherein the buffering circuit comprises:

a first MOSFET having a gate, a drain and a source;

a second MOSFET having a gate configured to receive the signal to be driven, a drain coupled to the source of the first MOSFET, and a source coupled to a biased potential or a ground potential; and an operational amplifier having two inputs and one output, where one amplifier input is coupled to the output terminal, another amplifier input is coupled to the source of the first MOSFET and coupled to the drain of the second MOSFET, and an amplifier output is coupled to the gate of the first MOSFET.

4. The output driver circuit of claim 3, wherein the second MOSFET is a sensing transistor.

5. The output driver circuit of claim 1, wherein the over-current detecting circuit comprises:

a reference circuit configured to provide a reference current in which to compare the replicated current condition at the output terminal to the reference current, and to output a signal to alleviate the over-current condition.

6. The output driver circuit of claim 2, wherein the drive limiting circuit further comprises:

a MOSFET configured to alleviate the over-current condition.

7. The output driver circuit of claim 1, wherein the buffering circuit comprises:

a non-inverting operational amplifier.

8. The output driver circuit of claim 1, wherein the buffering circuit comprises an operational amplifier with unity gain.

9. The output driver circuit of claim 1, wherein the replicated output current is substantially equivalent to the current at the output terminal.

10. The output driver circuit of claim 1, wherein the replicated output current is a fraction of the current at the output terminal.

11. The output driver circuit of claim 1, wherein the current mirror comprises:

two MOSFETs having substantially similar geometric ratios configured to generate a replicated current which is substantially equal to the current at the output terminal.

12. The output driver circuit of claim 1, wherein the current mirror comprises:

two MOSFETs having different geometric ratios configured to generate a replicated current which is a fraction of the current at the output terminal.

13. The output driver circuit of claim 1, wherein the output driver circuit further comprises a push-pull output stage amplifier.

14. The output driver circuit of claim 1, wherein the over-current detecting circuit is configured to detect current sourcing from the output terminal.

15. The output driver circuit of claim 1, wherein the over-current detecting circuit is configured to detect current sinking into the output terminal.

16. A current limited output driver circuit for driving an output terminal comprising:

an output transistor coupled to the output terminal;

a buffering circuit configured to indirectly monitor current at the output terminal;

a current mirror circuit configured to replicate the monitored current;

an over-current detecting circuit configured to detect an over-current condition in response to the current mirror circuit; and a feedback circuit coupled between the over-current detecting circuit and the output transistor, wherein the over-current condition is alleviated.

* * * * *